United States Patent
Oh

(10) Patent No.: US 9,177,652 B2
(45) Date of Patent: Nov. 3, 2015

(54) BAD BLOCK COMPENSATION FOR SOLID STATE STORAGE DEVICES

(75) Inventor: Hyun Oh Oh, Gwachon-si (KR)

(73) Assignee: Empire Technology Development LLC, Wilmington, DE (US)

(*) Notice: Subject to any disclaimer, the term of this patent is extended or adjusted under 35 U.S.C. 154(b) by 0 days.

(21) Appl. No.: 14/235,406

(22) PCT Filed: Jul. 30, 2012

(86) PCT No.: PCT/US2012/048849
§ 371 (c)(1),
(2), (4) Date: Jan. 27, 2014

(87) PCT Pub. No.: WO2014/021823
PCT Pub. Date: Feb. 6, 2014

(65) Prior Publication Data
US 2015/0131379 A1 May 14, 2015

(51) Int. Cl.
*G11C 16/04* (2006.01)
*G11C 16/10* (2006.01)
*G11C 29/04* (2006.01)
*G11C 29/00* (2006.01)
*G11C 16/08* (2006.01)
G11C 29/44 (2006.01)

(52) U.S. Cl.
CPC ............... *G11C 16/10* (2013.01); *G11C 16/08* (2013.01); *G11C 29/04* (2013.01); *G11C 29/765* (2013.01); *G11C 29/82* (2013.01); *G11C 2029/0409* (2013.01); *G11C 2029/4402* (2013.01)

(58) Field of Classification Search
CPC .......... G11C 11/5621; G11C 11/5628; G11C 11/5642; G11C 16/0483; G11C 16/10; G11C 16/26; G11C 2211/5641
USPC ............ 365/185.12, 45, 63, 120, 230.01, 100
See application file for complete search history.

(56) References Cited

U.S. PATENT DOCUMENTS

| 7,797,693 | B1 | 9/2010 | Gustafson et al. |
| 2005/0055531 | A1 | 3/2005 | Asami et al. |
| 2009/0327581 | A1 | 12/2009 | Coulson |
| 2010/0122022 | A1 | 5/2010 | Lou et al. |
| 2010/0235605 | A1 | 9/2010 | Perry et al. |
| 2010/0269000 | A1 | 10/2010 | Lee |
| 2012/0159052 | A1* | 6/2012 | Lee et al. ................. 711/103 |

OTHER PUBLICATIONS

Roselli, D. et al., A comparison of file system workloads, Proceedings of 2000 USENIX Annual Technical Conference, Jun. 18-23, 2000, pp. 1-15, The USENIX Association, San Diego, California, USA.

STMicroelectronics, Bad Block Management in NAND Flash Memories, AN1819 Application Note, May 2004, pp. 1-7.

United States Patent and Trademark Office, International Search Report and Written Opinion of the International Searching Authority for International Patent Application No. PCT/US2012/048849 mailed Nov. 27, 2012.

* cited by examiner

*Primary Examiner* — Thong Q Le

(57) ABSTRACT

Technologies and implementations for reusing bad blocks in a solid state drive are generally disclosed.

26 Claims, 5 Drawing Sheets

500 A computer program product

502 A signal bearing medium

504 Machine-readable instructions that, when executed by one or more processors, operatively enable a memory control module to:

identify an address associated with one or more bad memory cells in a memory page of a solid state storage device;

determine a usable size and a direction of writing to the memory page identified by the address of the one or more bad memory cells of the solid state storage device;

store the determined usable size and the direction of writing to the memory page of the one or more bad memory cells of the solid state storage device;

receive a request to write a unit of data to the solid state storage device;

identify a data size associated with the unit of data;

select one or more memory pages of the solid state storage device, based at least in part on the data size and on the stored usable size for writing to the one or more memory pages of the solid state storage device; and write the unit of data to the selected one or more pages of the solid state storage device.

| 506 a computer-readable medium | 508 a recordable medium | 510 a communications medium |
|---|---|---|

Fig. 5

BAD BLOCK COMPENSATION FOR SOLID STATE STORAGE DEVICES

This application a U.S. national stage entry under 35 U.S.C. §371 of International Application No. PCT/US2012/048849, filed on Jul. 30, 2012.

BACKGROUND

Unless otherwise indicated herein, the approaches described in this section are not prior art to the claims in this application and are not admitted to be prior art by inclusion in this section.

Memory locations within a solid state storage device (SSD) may be grouped into sections, referred to as "pages". In general, a page may be comprised of a number of memory locations, or "blocks". As will be appreciated, some memory blocks within an SSD may not be able to accurately record data. Such blocks may often be referred to as "bad blocks". Conventional SSDs may be able to compensate for a specified number (e.g., 1, 2, or the like) of bad blocks. That is, the SSDs may be able to compensate for a certain number of bit errors (e.g., 1 bit, 2 bits, or the like). However, once a page includes more bad blocks than the SSD can compensate for, the entire page may be unusable. That is, all blocks within the page, including the good blocks, may be unavailable to store and retrieve data.

SUMMARY

Detailed herein are various illustrative methods for reusing bad blocks in a solid state device. Example methods may include identifying an address associated with one or more bad memory cells in a memory page of a solid state storage device, determining a usable size and a direction of writing to the memory page identified by the address of the one or more bad memory cells of the solid state storage device, and storing the determined usable size and the direction of writing to the memory page of the one or more bad memory cells of the solid state storage device.

The present disclosure also describes various example machine readable non-transitory medium having stored therein instructions that, when executed, cause a device to compensate for bad blocks in a solid state device. Example machine readable non-transitory media may have stored therein instructions that, when executed by one or more processors, operatively enable a memory control module to identify an address associated with one or more bad memory cells in a memory page of a solid state storage device, determine a usable size and a direction of writing to the memory page identified by the address of the one or more bad memory cells of the solid state storage device, and store the determined usable size and the direction of writing to the memory page of the one or more bad memory cells of the solid state storage device.

The present disclosure additionally describes example systems. Example systems may include a solid state storage device, and a memory control module communicatively coupled to the solid state storage device, the memory control module capable of being operatively enabled to identify an address associated with one or more bad memory cells in a memory page of a solid state storage device, determine a usable size and a direction of writing to the memory page identified by the address of the one or more bad memory cells of the solid state storage device, and store the determined usable size and the direction of writing to the memory page of the one or more bad memory cells of the solid state storage device.

The foregoing summary is illustrative only and not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure, and are therefore, not to be considered limiting of its scope. The disclosure will be described with additional specificity and detail through use of the accompanying drawings.

In the drawings:

FIG. 5 is an illustration of an example computer program product; and

DETAILED DESCRIPTION

Figure 1:
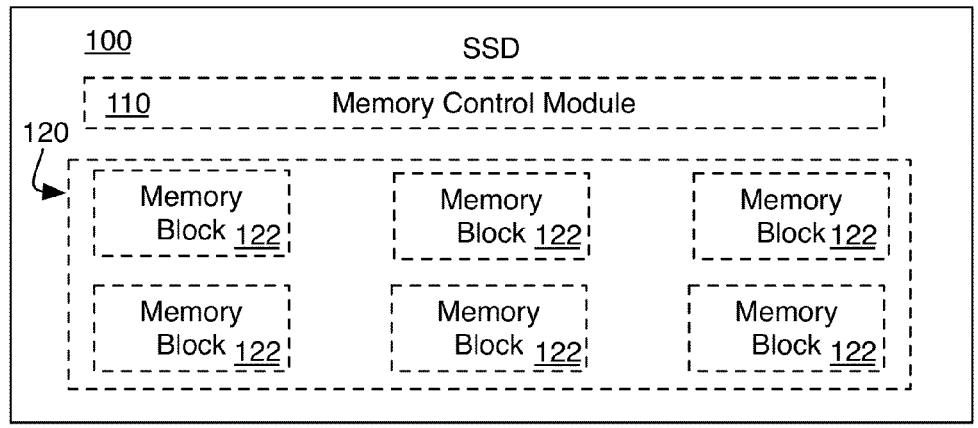
FIG. 1 is an illustration of a block diagram of an example solid state storage device (SSD)

The following description sets forth various examples along with specific details to provide a thorough understanding of claimed subject matter. It will be understood by those skilled in the art that claimed subject matter might be practiced without some or more of the specific details disclosed herein. Further, in some circumstances, well-known methods, procedures, systems, components and/or circuits have not been described in detail, in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, devices, systems and computer readable media related to compensating for bad blocks in a solid state storage device (SSD).

In general, various embodiments disclosed herein may be used to store data in pages that contain bad blocks. For example, suppose an SSD is capable of compensating for a single bit error in a page. Further suppose that a page in the SSD includes multiple bad blocks that each has at least one bit error in the block. At least some embodiments disclosed herein may be used to allow a portion of the page to be used. For example, locations of the memory cells that cause the bit errors may be determined. Then, using the determined locations of the memory cells causing the bit errors, a direction of writing and a usable size for the page may be determined. The determined direction of writing and usable size may then be used to enable at least a portion of the page to be used to store data. As a result, a portion of the page (e.g., that includes a correctable number of bad blocks) may be used based on the direction of writing (e.g., forwards, backwards, or the like) and the usable size (e.g., in bytes, or the like).

The aforementioned example is given for illustrative purposes only and is not intended to be limiting. This illustrative example, as well as other examples and embodiments will be further described herein. In order to aid in this description, the following illustrative descriptions of an example SSD, an example computer system including an SSD and an example set of pages are given. These examples of an SSD, computer system and page are given prior to resuming discussion of various illustrative embodiments for reusing bad blocks in an SSD and are also not intended to be limiting.

As will be appreciated, SSDs (e.g., a NAND flash memory device, a NOR flash memory device, or the like) may include logic (e.g., transistors, or the like) configured to allow data to be persistently stored in the SSDs. In general, the logic that is used to store data in an SSD may be organized into a number of addressable memory locations, referred to as memory blocks. As used herein, a memory block may refer to a single memory cell (e.g., a memory cell capable of storing 1 byte, or the like). Alternatively, a memory block may refer to a group of memory cells. For example, a memory block may refer to a group of memory cells (e.g., 8 bytes, 16 bytes, 512 bytes, or the like). In some embodiments, memory cells within a block may have contiguous addresses.

FIG. 1 illustrates a block diagram of an example solid state storage device (SSD) 100, arranged in accordance with at least some embodiments described herein. As can be seen from this figure, the SSD 100 may include a memory control module 110 and a memory array 120. The memory array 120 may include a number of memory blocks 122. In general, the memory blocks 122 may be comprised of any type of integrated circuit assembly that may be configured to persistently store data. For example, the memory blocks 122 may be comprised of NAND flash memory components.

In general, the memory control module 110 may include logic and/or features configured to facilitate writing data to and reading data from the memory blocks 122 within the memory array 120. More specifically, the memory control module 110 may provide access to the memory array 120. For example, the memory control module 110 may be used to allow a host computer system to access (e.g., write data to and read data from) the memory array 120. The memory control module 110 may also include logic and/or features configured to perform additional functions (e.g., error correction, wear leveling, bad block detection, read scrubbing, encryption, garbage collection, formatting, or the like) for managing the memory array 120.

As will be appreciated, some memory blocks (e.g., a one or more of the memory blocks 122) may be detected and flagged as "bad blocks". In general, a bad block may be a memory block (e.g., a one of the memory blocks 122, or the like) that is unsuitable for use. For example, if a component (e.g., a transistor, a memory cell, or the like) within a memory block 122 fails (e.g., during manufacturing, during testing, during use, or the like) the memory block may not be usable (e.g., cannot be written to, cannot be read from, cannot reliably store data, or the like). Memory blocks that are unusable may be referred to as bad blocks.

Although conventional SSDs may include some techniques to deal with bad blocks (e.g., detection, error correction, remapping, or the like), such techniques may not allow for pages that contain bad blocks to be reused. More particularly, once a page includes a certain number of bad blocks, the entire page may become unusable to store data. This concept will be further discussed below.

Figure 2:
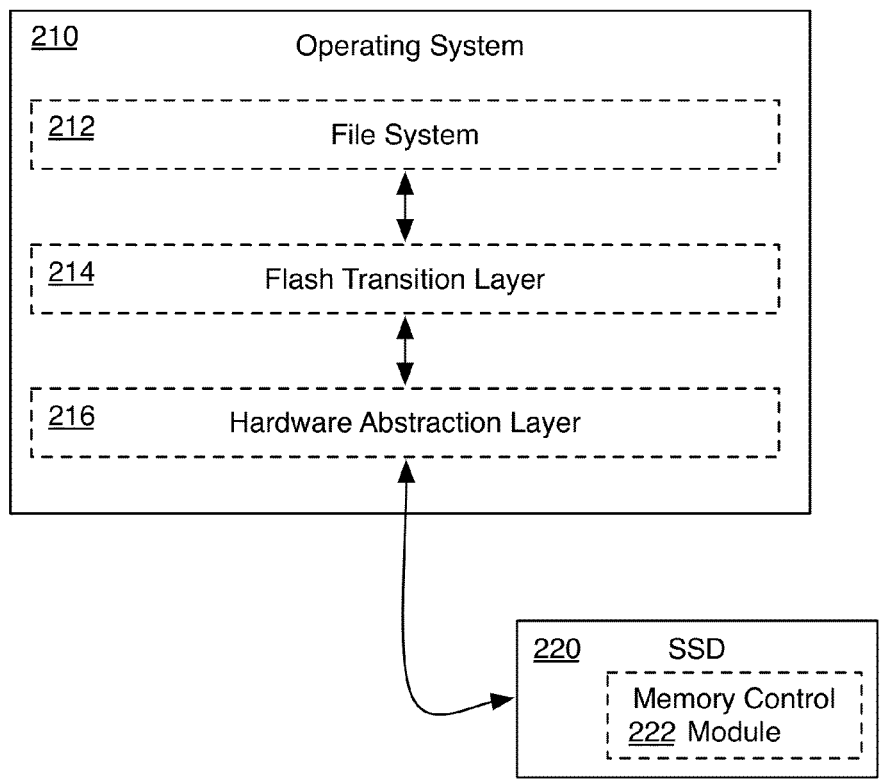
FIG. 2 is an illustration of a block diagram of an example computer system including an SSD.

As will be appreciated, computer systems (e.g., laptops, tablets, phones, media players, or the like) often include SSDs. FIG. 2 illustrates a block diagram of an example computer system including an SSD, arranged in accordance with at least some embodiments described herein. As can be seen from this figure, a computer system 200 including an operating system 210 and an SSD 220 may be shown. As will be appreciated, the computer system 200 may also include other components (e.g., a processor, a memory, a GPU, or the like), which are not shown in FIG. 2 for clarity. The SSD 220 may be shown having a memory control module 222. The SSD 220 may also include a memory array (e.g., the memory array 120, or the like) that may include memory blocks (e.g., the memory blocks 122, or the like). However, a memory array and memory blocks may also not be shown in FIG. 2 for clarity.

As used herein, a solid state storage device (SSD) may refer to a memory device having multiple memory cells or blocks. For example, the SSD 100 may be referred to as a solid state storage device. Furthermore, the term SSD may be used herein to refer to a solid state disk drive. For example, although not shown in FIG. 2, the SSD 220 may include a flash translation layer (e.g., the FTL 214, or the like) and a hardware abstraction layer (e.g., the HAL 216). Accordingly, various embodiments of the present disclosure may be implemented in conjunction with a solid state storage device or a solid state disk drive. As such, the various examples given herein are not intended to be limiting in this regard.

The operating system 210 may be any type of operating system (e.g., ANDROID, IOS, WINDOWS PHONE, OSX, MICROSOFT WINDOWS, UNIX, LINUX, or the like). As will be appreciated, the operating system 210 may include logic and/or features configured to manage hardware components (e.g., a processor, a memory, a GPU, the SSD 220, or the like) of the computer system 200. Furthermore, the operating system 210 may include logic and/or features configured to manage software applications (e.g., a word processor, a video game, or the like) that may be executed on the computer system 200.

Data for use by the computer system 200 (e.g., user data, application data, settings data, or the like) may be represented in a file system 212 of the operating system 210. In general, the file system 212 may have any type of organizational schema (e.g., flat, hierarchical, journaled, versioned, or the like). Furthermore, the file system 212 may be used to represent data stored on a variety of data storage devices (e.g., magnetic devices, optical devices, SSD devices, or the like) that may be formatted using a variety of standards (e.g., FAT, EXT, or the like). For example, data represented in the file system 212 may be stored on the SSD 220. Accordingly, the operating system 210 may rely on a flash transition layer 214 and a hardware abstraction layer 216 to help facilitate data stored on the SSD 220 be available in the file system 212.

In general, the flash transition layer (FTL) 214 may be any type of flash memory array management system (e.g., TrueFFS, M-Systems, JFFS, EXTREMEFFS, or the like). The FTL 214 may include logic and/or features configured to perform memory management functions (e.g., garbage collection, wear leveling, or the like). In some embodiments, the FTL 214 may work in conjunction with the memory control module 222 to perform the various memory management functions for the memory array in the SSD 220.

In general, the hardware abstraction layer (HAL) 216 may be any type of hardware emulation platform that may be configured to provide device-independent access to hardware. For example, the HAL 216 may include logic and/or features configured to provide access to the SSD 220, regardless of the manufacturer or type of SSD. The HAL 216 may use a device driver to translate device-independent operations to device-specific operations. In some embodiments, the HAL 216 may be configured to perform other device specific operations (e.g., bad block detection, error correction, or the like). In some embodiments, the HAL 216 may work in conjunction with the memory control module 222 to perform the various memory management functions for the memory blocks within the SSD 220.

As indicated above, memory blocks within an SSD (e.g., the memory blocks 122, or the like) may be organized into "pages". For example, the memory control module 110 may organize the memory blocks 122 into pages such that when a device (e.g., a cell phone, a laptop computer, a tablet computer, or the like) accesses the SSD, the pages may be made available to store data. As another example, the operating system 210 (e.g., using the FTL 214, the HAL 216 and/or the memory control module 222, or the like) may organize the memory blocks in the SSD 220 into pages as part of a memory management process.

Figure 3:
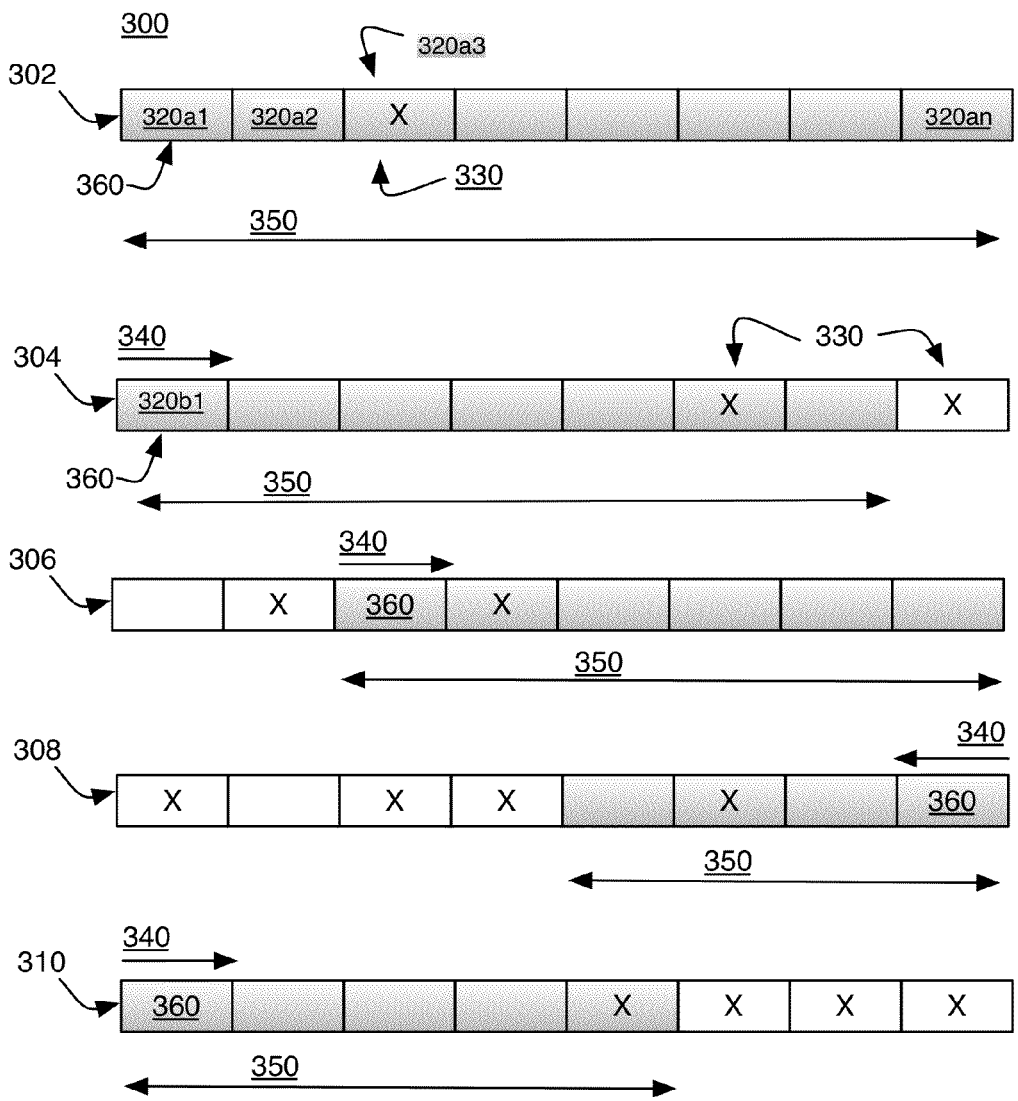
FIG. 3 is an illustration of a block diagram of an example set of page files.

FIG. 3 is an illustration of a block diagram of an example set of page files, arranged in accordance with at least some embodiments described herein. In general, a page may be a set of contiguous memory blocks. As illustrated, pages 300 may include one or more pages including pages 302, 304, 306, 308 and 310. As can be seen, the pages 300 may be comprised of a number of memory blocks 320, which may be comprised of one or more memory cells. In general, a page (e.g., the page 302, or the like) may include any number of memory blocks 320. Furthermore, a page (e.g., the page 302, or the like) may correspond to any amount of memory (e.g., 1024 bytes, 4096 bytes, or the like). However, as will be appreciated, the amount of memory available within each page may depend upon the size of each memory block 320 (e.g., the number of memory cells within each memory block, or the like) and the number of memory blocks 320 per page.

Pages (e.g. the pages 300, or the like) may be used as a convenient way to store data in an SSD. For example, if the pages 300 each corresponded to 4096 byte sections of an SSD, then each of the pages 300 could store a file that was 4096 bytes or less. Files that are larger than 4096 bytes can be split and stored in multiple pages. As such, a contiguous section of the SSD that could hold the larger file may not need to be found. Instead, the file could be stored in non-contiguous sections using pages.

As will be appreciated, some memory blocks (e.g., one or more of the memory blocks 122, one or more of the memory blocks 320, or the like) may be "bad blocks". In general, a bad block may be a memory block that is unsuitable for use. For example, a memory block may include a number of components (e.g., a transistor, a memory cell, or the like). Furthermore, a component within a memory block may fail (e.g., during manufacturing, during testing, during use, or the like). As a result of the failure, the memory block may not be usable (e.g., cannot be written to, cannot be read from, cannot reliably store data, or the like). Memory blocks that are unusable may be referred to as bad blocks.

Generally, bad blocks may be detected and flagged so that they can be properly dealt with during use. For example, a memory controller (e.g., the memory control module 110, the memory control module 222, or the like) may detect a bad block. Additionally, a software component (e.g., the operating system 210, the FTL 214, the HAL 216, or the like) may detect a bad block. Furthermore, the detection of bad blocks may take place during manufacturing and/or testing, or during use. In general, when a bad block is written to or read from, one or more bit errors may result. SSDs may be able to compensate for (e.g. using error correction, remapping, or the like) a small number of bad blocks. Accordingly, a specified number of bad blocks, or bit errors (e.g., 1 bit, 2 bits, 8 bits, or the like) may be corrected within a page. However, once the number of bit errors (e.g., due to bad blocks or the like) within a page exceeds the correctable number of bit errors, the entire page may become unusable.

FIG. 3 shows a number of bad blocks ("X") 330 within the pages 300. As an example, assuming that each bad block 330 in the pages 300 corresponded to a single bit error and further that 1 bit error per page was correctable, the page 302 may be used. More specifically, as can be seen, the pages 304, 306, 308 and 310 may each include more than one bad block, which may correspond to more than 1 bit error per page. As such, any data written to or read from the pages 304, 306, 308 and 310 may include more bit errors than can be corrected.

Various embodiments disclosed herein may be used to store data in these pages 300 (e.g., the page 304, or the like) even though they may include more bit errors than can be corrected. In some embodiments, locations of the blocks 320 in one of the pages 300 that have bad memory cells (e.g., the bad blocks 330) may be determined. Using the determined locations, a direction of writing and a usable size may be determined for that page 300. Data less than or equal to the usable size may then be stored in the page using the direction of writing. For example, FIG. 3 shows a direction of writing 340 and a usable size 350 (also indicated by the shaded blocks for each of the pages 300).

In some embodiments disclosed herein, data may be stored in pages 300 having bad blocks 330 by determining a first memory cell 360 and a usable size 350 based on the locations of the bad blocks 330. Data less than or equal to the usable size may then be stored in the page using the memory address of the first memory cell. Furthermore, FIG. 3 also shows first memory cells 360 of the pages 300. In general, the first memory cells 360 may be the memory cell having the lowest memory address.

As indicated above, a number of components within both an SSD and a computer system (e.g., the FTL 214, the HAL 216, or the like) may include logic and/or features configured to manage pages (e.g., the pages 300, or the like) in an SSD. For example, the memory control module 110 may be configured to manage pages in the SSD 100. Additionally, the memory control module 222, the FTL 214, or the HAL 216 may be configured to manage pages in the SSD 220. Furthermore, one or more of a number of different components within an SSD or a computer system may be configured to perform bad block management functions. In general, bad block management functions may include detection of bad blocks, performing error correction on data, or other similar functions. For example, the memory control module 110 may be configured to perform bad block functions on the SSD 100. Accordingly, the memory control module 110, the memory control module 222, the FTL 214, the HAL 216, and/or other components of an SSD or a computer system may implement various embodiments disclosed herein. However, for clarity of presentation and with no intention to be limiting, some embodiments disclosed herein will be described with reference to the memory control module 222 and the pages 300.

Figure 4:
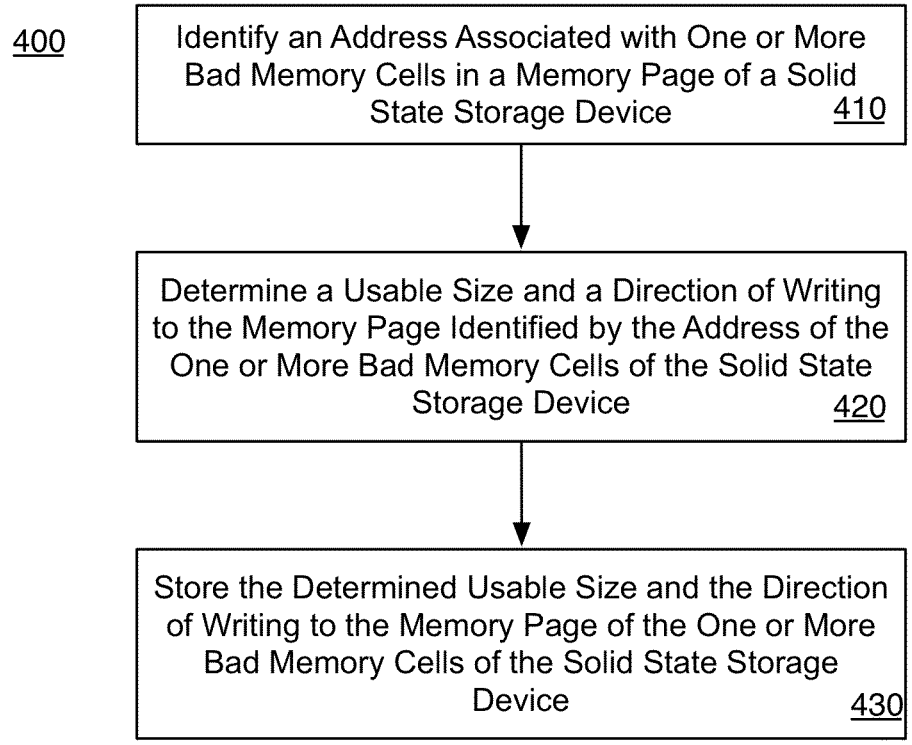
FIG. 4 is an illustration of a flow diagram of an example method for reusing bad blocks in an SSD.

FIG. 4 illustrates a flow chart of an example method for reusing bad blocks in an SSD, arranged in accordance with at least some embodiments disclosed herein. In some portions of the description, illustrative implementations of the method may be described with reference to the SSD 100, the computer system 200 and/or the pages 300 depicted in FIGS. 1, 2 and 3 respectively. However, the described embodiments are not limited to this depiction. More specifically, some elements depicted in FIGS. 1, 2 and 3 may be omitted from some implementations of the methods detailed herein. Furthermore, other elements not depicted in FIGS. 1, 2 and 3 may be used to implement example methods detailed herein.

Additionally, FIG. 4 employs various blocks to illustrate the example methods detailed therein. These block diagrams may set out various functional blocks or actions that may be described as processing steps, functional operations, events and/or acts, etc., and may be performed by hardware, software, and/or firmware. Numerous alternatives to the functional blocks detailed may be practiced in various implementations. For example, intervening actions not shown in the figures and/or additional actions not shown in the figures may be employed and/or some of the actions shown in the figures may be eliminated. In some examples, the actions shown in one figure may be operated using techniques discussed with respect to another figure. Additionally, in some examples, the actions shown in these figures may be performed using parallel processing techniques. The above described, and other not described, rearrangements, substitutions, changes, modifications, etc., may be made without departing from the scope of claimed subject matter.

Method 400 may begin at block 410. At block 410 ("Identify an Address Associated with One or More Bad Memory Cells in a Memory Page of a Solid State Storage Device"), the memory control module 222 may include logic and/or features configured to identify an address associated with one or more bad memory cells in a memory page of an SSD. In general, at block 410, the memory control module 222 may identify (e.g., using bad block detection, based on bit flags, based on a check disk utility, or the like) memory address(es) associated with bad block(s) 330 in one of the pages 300. For example, at block 410, the memory control module 222 may identify the memory addresses associated with the bad blocks 330 (denoted by an "X" in FIG. 3) in the page 304.

Continuing from block 410 to block 420 ("Determine a Usable Size and a Direction of Writing to the Memory Page Identified by the Address of the One or More Bad Memory Cells of the Solid State Storage Device"), the memory control module 222 may include logic and/or features configured to determine a usable size and a direction of writing to the memory page identified by the address of the one or more bad memory cells in the SSD. In general, at block 420, the memory control module 222 may determine a usable size 350 and a direction of writing 340 based on the locations of the bad blocks 330.

For example, assuming that the pages 300 may each correspond to 4096 bytes and that a single bad block 330 (e.g., 1 bit error, 2 bit errors, or the like) may be corrected in the pages 300, an optimal direction of writing 340 and a usable size 350 may be determined from the determined locations of the bad blocks 330. As can be seen from FIG. 3, even pages 304, 306, 308 and 310, which have more bad blocks than can be corrected using conventional techniques, may be used. That is, a direction of writing 340 and a usable size 350 may be determined. It will be appreciated, that although the above example may be reused throughout this disclosure, and particularly with respect to FIG. 3, that some embodiments described herein are applicable to other examples (e.g., where the pages are 1024 bytes, where multiple bad blocks may be corrected, where no bad blocks can be corrected, or the like).

In general, the direction of writing 340 may correspond to either a "forward" or "backward" direction. In some embodiments, a forward direction 340 may mean that data may be written to the page 300 from the first block 320 of the page towards the last block 320. Similarly, a backward direction 340 may mean that data may be written to the page 300 from the last block 320 of the page towards the first block 320. For example, pages 304 and 310 may be shown as having a forward direction 340 indicated in FIG. 3 while pages 306 and 308 may be shown as having a backward direction 340 indicated. In some embodiments, the direction 340 may be determined by setting the direction of writing such that the most usable memory blocks can be written to before more than a correctable number of bad blocks are encountered. As such, the usable size 350 of the page may be maximized.

In general, the usable size 350 may correspond to the number of memory blocks 320 that can be written to using the determined direction of writing 340 prior to encountering an uncorrectable number of bad blocks. Using the example laid out above where each of the pages 300 corresponds to 4096 bytes and where a single bad block can be corrected, a usable size 350 for the page 304 may be determined from the location of the bad blocks 330 and the direction of writing 340. Accordingly, using the given example, the size of each block 320 may be 512 bytes. Accordingly, using the give example, the usable size 350 for the page 304 would equal 3584 bytes.

Similarly, using the same example, the usable size 350 for the other pages 300 may be calculated as 3076 bytes for the page 306, 2048 bytes for the page 308 and 2560 bytes for the page 310.

Continuing from block 420 to block 430 ("Store the Determined Usable Size and the Direction of Writing to the Memory Page of the One or More Bad Memory Cells of the Solid State Storage Device"), the memory control module 222 may include logic and/or features configured to store the determined usable size and the direction of writing to the memory page of the one or more bad memory cells in the SSD. In general, at block 430, the memory control module 222 may store (e.g., set a flag in the page, update a page file table, or the like) the determined direction of writing and the usable size.

For example, in some embodiments, a table to store information regarding the pages may be generated. The following table may correspond to the pages 300, the direction of writing 340 and usable size 350 indicated in FIG. 3.

TABLE 1

| Page No. | Usable Size | Direction |
|---|---|---|
| 302 | 4096 | Forward |
| 304 | 3584 | Forward |
| 306 | 3076 | Backward |
| 308 | 2048 | Backward |
| 310 | 2560 | Backward |

As can be seen from table 1, the pages 300, a usable size 350 and a direction of writing 340 may be listed. Accordingly, with some embodiments disclosed herein, the table may be used to allow some pages 300 having bad blocks 330 to be used to store data, even where more bad blocks 330 are present than can be corrected. For example, table 1 may be used to determine that the page 304 could be used to store a file having a size of less than 3584 bytes.

In some embodiments, a table (e.g., table 1, or the like) may include columns for a memory address (not shown in Table 1) for each page and the usable size of the page. In some embodiments, a table (e.g., table 1, or the like) may only list pages that have a usable size of less than the entire page. Subsequently, when a file having a size of less than an entire page needs to be written to the SSD, then the table may be consulted to determine if one of the pages listed in the table could be used.

In some embodiments, a direction of writing flag may be recorded on the SSD (e.g., in the page, in an LBA partition table, or the like). Accordingly, when the page is written to or read from the direction of writing flag may be used to control the direction of writing or reading.

In general, the method described with respect to FIG. 4 and elsewhere herein may be implemented as a computer program product, executable on any suitable computing system, or the like. For example, a computer program product for reusing bad blocks in an SSD may be provided. Example computer program products are described with respect to FIG. 5 and elsewhere herein.

FIG. 5 illustrates an example computer program product 500, arranged in accordance with at least some embodiments of the present disclosure. Computer program product 500 may include machine readable non-transitory medium having stored therein instructions that, when executed, cause the machine to facilitate compensating for bad blocks in an SSD according to the processes and methods discussed herein. Computer program product 500 may include a signal bearing medium 502. Signal bearing medium 502 may include one or more machine-readable instructions 504, which, when executed by one or more processors, may operatively enable a computing device to provide the functionality described herein. In various examples, some or all of the machine-readable instructions may be used by the devices discussed herein.

In some examples, the machine readable instructions 504 may include instructions to identify an address associated with one or more bad memory cells in a memory page of a solid state storage device. In some examples, the machine readable instructions 504 may include instructions to determine a usable size and a direction of writing to the memory page identified by the address of the one or more bad memory cells of the solid state storage device. In some examples, the machine readable instructions 504 may include instructions to store the determined usable size and the direction of writing to the memory page of the one or more bad memory cells of the solid state storage device. In some examples, the machine readable instructions 504 may include instructions to receive a request to write a unit of data to the solid state storage device. In some examples, the machine readable instructions 504 may include instructions to identify a data size associated with the unit of data. In some examples, the machine readable instructions 504 may include instructions to select one or more memory pages of the solid state storage device, based at least in part on the data size and on the stored usable size for writing to the one or more memory pages of the solid state storage device. In some examples, the machine readable instructions 504 may include instructions to write the unit of data to the selected one or more pages of the solid state storage device.

In some implementations, signal bearing medium 502 may encompass a computer-readable medium 506, such as, but not limited to, a hard disk drive, a Compact Disc (CD), a Digital Versatile Disk (DVD), a digital tape, memory, etc. In some implementations, the signal bearing medium 502 may encompass a recordable medium 508, such as, but not limited to, memory, read/write (R/W) CDs, R/W DVDs, etc. In some implementations, the signal bearing medium 502 may encompass a communications medium 510, such as, but not limited to, a digital and/or an analog communication medium (e.g., a fiber optic cable, a waveguide, a wired communication link, a wireless communication link, etc.). In some examples, the signal bearing medium 502 may encompass a machine readable non-transitory medium.

In general, the methods described with respect to FIG. 4 and elsewhere herein may be implemented in any suitable server and/or computing system. Example systems may be described with respect to FIG. 6 and elsewhere herein. In some examples, a resource, data center, data cluster, cloud computing environment, or other system as discussed herein may be implemented over multiple physical sites or locations. In general, the system may be configured to compensate for bad blocks in an SSD.

Figure 6:
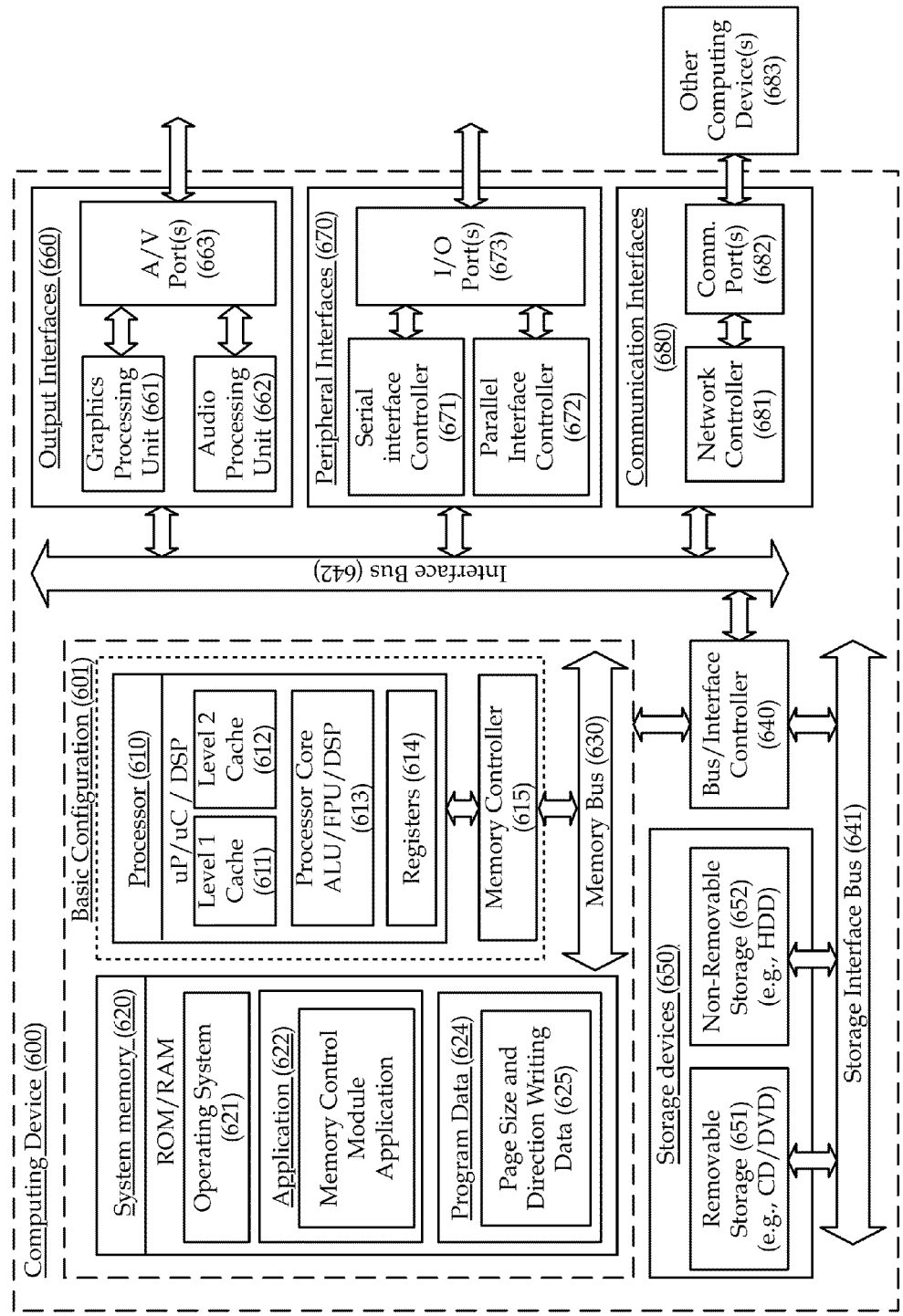
FIG. 6 is an illustration of a block diagram of an example computing device, all arranged in accordance with at least some embodiments described herein.

FIG. 6 is a block diagram illustrating an example computing device 600, arranged in accordance with at least some embodiments of the present disclosure. In various examples, computing device 600 may be configured to reuse pages in an SSD that contain bad blocks as discussed herein. In various examples, computing device 600 may be configured to compensate for bad blocks in an SSD as a memory control module or as part of an operating system virtual memory management system as discussed herein. In one example of a basic configuration 601, computing device 600 may include one or more processors 610 and a system memory 620. A memory bus 630 can be used for communicating between the one or more processors 610 and the system memory 620.

Depending on the desired configuration, the one or more processors 610 may be of any type including but not limited to a microprocessor (μP), a microcontroller (μC), a digital signal processor (DSP), or any combination thereof. The one or more processors 610 may include one or more levels of caching, such as a level one cache 611 and a level two cache 612, a processor core 613, and registers 614. The processor core 613 can include an arithmetic logic unit (ALU), a floating point unit (FPU), a digital signal processing core (DSP Core), or any combination thereof. A memory controller 615 can also be used with the one or more processors 610, or in some implementations the memory controller 615 can be an internal part of the processor 610.

Depending on the desired configuration, the system memory 620 may be of any type including but not limited to volatile memory (such as RAM), non-volatile memory (such as ROM, flash memory, etc.) or any combination thereof. The system memory 620 may include an operating system 621, one or more applications 622, and program data 624. The one or more applications 622 may include memory control module application 623 that can be arranged to perform the functions, actions, and/or operations as described herein including the functional blocks, actions, and/or operations described herein. The program data 624 may include page size and direction writing data 625 for use with the memory control module application 623. In some example embodiments, the one or more applications 622 may be arranged to operate with the program data 624 on the operating system 621. This described basic configuration 601 is illustrated in FIG. 6 by those components within dashed line.

Computing device 600 may have additional features or functionality, and additional interfaces to facilitate communications between the basic configuration 601 and any required devices and interfaces. For example, a bus/interface controller 640 may be used to facilitate communications between the basic configuration 601 and one or more data storage devices 650 via a storage interface bus 641. The one or more data storage devices 650 may be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 620, the removable storage 651 and the non-removable storage 652 are all examples of computer storage media. The computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by the computing device 600. Any such computer storage media may be part of the computing device 600.

The computing device 600 may also include an interface bus 642 for facilitating communication from various interface devices (e.g., output interfaces, peripheral interfaces, and communication interfaces) to the basic configuration 601 via the bus/interface controller 640. Example output interfaces 660 may include a graphics processing unit 661 and an audio processing unit 662, which may be configured to communicate to various external devices such as a display or speakers via one or more NV ports 663. Example peripheral interfaces 670 may include a serial interface controller 671 or a parallel interface controller 672, which may be configured to communicate with external devices such as input devices (e.g., keyboard, mouse, pen, voice input device, touch input device, etc.) or other peripheral devices (e.g., printer, scanner, etc.) via one or more I/O ports 673. An example communication interface 680 includes a network controller 681, which may be arranged to facilitate communications with one or more other computing devices 683 over a network communication via one or more communication ports 682. A communication connection is one example of a communication media. The communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

The computing device 600 may be implemented as a portion of a small-form factor portable (or mobile) electronic device such as a cell phone, a mobile phone, a tablet device, a laptop computer, a personal data assistant (PDA), a personal media player device, a wireless web-watch device, a personal headset device, an application specific device, or a hybrid device that includes any of the above functions. The computing device 600 may also be implemented as a personal computer including both laptop computer and non-laptop computer configurations. In addition, the computing device 600 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

The claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with the claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be affected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to subject matter containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method for a memory control module, the method comprising:
   identifying an address associated with one or more bad memory cells in a memory page of a solid state storage device;
   determining a first address value of a first memory cell in the memory page based at least in part on the address of the one or more bad memory cells of the solid state storage device and a number of correctable bad memory cells in the memory page;
   determining a usable size of the memory page based at least in part on the first address value; and
   storing the first address value and the determined usable size, wherein the first address value and the determined usable size facilitates utilization of the memory page of the solid state storage device,
   wherein identifying the address associated with one or more bad memory cells includes identifying addresses associated with uncorrectable bad memory cells in the memory page of the solid state storage device.

2. The method of claim 1, further comprising:
   receiving a request to write a unit of data to the solid state storage device;
   identifying a data size associated with the unit of data;
   selecting one or more memory pages of the solid state storage device, based at least in part on the data size and on the stored usable size, to write to the one or more memory pages of the solid state storage device; and
   writing the unit of data to the selected one or more pages of the solid state storage device.

3. The method of claim 2, wherein writing the unit of data comprises:
   writing the unit of data starting from the determined first address value corresponding to each of the one or more pages.

4. The method of claim 3, further comprising:
   determining a direction to write to the memory page based at least in part on the first address value; and wherein writing the unit of data includes writing the unit of data to one or more pages of the solid state storage device starting in the identified direction.

5. The method of claim 4, wherein writing the unit of data starting in the identified direction comprises:
   writing the unit of data to one or more pages of the solid state storage device in a forward direction, wherein the unit of data is written to one or more of the memory cells of the page in an ascending order of cell addresses.

6. The method of claim 4, wherein writing the unit of data starting in the identified direction comprises:
   writing the unit of data to one or more pages of the solid state storage device in a backward direction, wherein the unit of data is written to one or more of the memory cells of the page in a descending order of cell addresses.

7. The method of claim 1, wherein storing the first address value and the determined useable size for the page of the solid state storage device comprises generating a table comprising a page address, the first address value, and the determined useable size of the memory page of the solid state storage device.

8. The method of claim 1, further comprising:
   receiving a request to read data from the memory page of the solid state storage device; and
   reading data from the memory page starting from the first address value.

9. The method of claim 4, wherein reading data from the memory page comprises:
   reading data in the determined direction to write.

10. A machine readable non-transitory medium having stored therein instructions that, in response to execution by one or more processors, operatively enable a memory control module to perform or cause to be performed:
    identify an address associated with one or more bad memory cells in a memory page of a solid state storage device;
    determine a first address value of a first memory cell based at least in part on the one or more bad memory cells of the solid state storage device;
    determine a forward or backward write direction based on a number of usable memory cells and correctable bad memory cells that precede an uncorrectable bad memory cell in either direction;
    determine a usable size of the memory page based at least in part on the first address value and the write direction; and
    store the first address value and the determined usable size.

11. The machine readable non-transitory medium of claim 10, wherein the stored instructions that, in response to execution by the one or more processors, further operatively enable the memory control module to perform or cause to be performed:
    detect a request to write a unit of data to the solid state storage device;
    identify a data size associated with the unit of data;
    select one or more memory pages of the solid state storage device, based at least in part on the data size and on the stored usable size to write to the one or more memory pages of the solid state storage device; and
    write the unit of data to the selected one or more pages of the solid state storage device.

12. The machine readable non-transitory medium of claim 11, wherein to write the unit of data, the stored instructions in response to execution by the one or more processors, operatively enable the memory control module to perform or cause to be performed:
write the unit of data starting from the determined first address value corresponding to each of the one or more pages.

13. The machine readable non-transitory medium of claim 11, wherein to write the unit of data, the stored instructions in response to execution by the one or more processors, operatively enable the memory control module to perform or cause to be performed:
write the unit of data in the determined direction to write.

14. The machine readable non-transitory medium of claim 13, wherein to write the unit of data, the stored instructions in response to execution by the one or more processors, operatively enable the memory control module to perform or cause to be performed:
write the unit of data in the forward direction, wherein the unit of data is written to one or more of the memory cells of the page in an ascending order of cell addresses.

15. The machine readable non-transitory medium of claim 13, wherein to write the unit of data, the stored instructions in response to execution by the one or more processors, operatively enable the memory control module to perform or cause to be performed:
write the unit of data in the backward direction, wherein the unit of data is written to one or more of the memory cells of the page in a descending order of cell addresses.

16. The machine readable non-transitory medium of claim 10, wherein to identify the address associated with one or more bad memory cells in the memory page of the solid state storage device, the stored instructions, in response to execution by the one or more processors, operatively enable the memory control module to perform or cause to be performed:
identify one or more bad memory cells in the page of the solid state storage device as uncorrectable bad memory cells.

17. The machine readable non-transitory medium of claim 10, wherein the machine readable non-transitory medium has further stored therein instructions that, in response to execution by the one or more processors, further operatively enable the memory control module to perform or cause to be performed:
generate a table comprising a page address, the first address value and the determined useable size for the page of the solid state storage device.

18. The machine readable non-transitory medium of claim 10, wherein the machine readable non-transitory medium has further stored therein instructions that, in response to execution by the one or more processors, further operatively enable the memory control module to perform or cause to be performed:
detect a request to read data from the memory page of the solid state storage device; and
read data from the memory page starting from the first address value.

19. A system, comprising:
a solid state storage device; and
a memory control module communicatively coupled to the solid state storage device, the memory control module capable of being operatively enabled to perform or cause to be performed:
identify an address associated with one or more bad memory cells in a memory page of the solid state storage device;
determine a first address value of a first memory cell based at least in part on the one or more bad memory cells of the solid state storage device; and
determine a usable size of the memory page based at least in part on the first address value; and
store the first address value and the determined usable size, wherein the determined usable size and a direction to write facilitates utilization of the memory page of the solid state storage device,
wherein the one or more bad memory cells in the memory page of the solid state storage device are uncorrectable bad memory cells.

20. The system of claim 19, wherein the memory control module is further operatively enabled to perform or cause to be performed:
detect a request to write a unit of data to the solid state storage device;
identify a data size associated with the unit of data;
select one or more memory pages of the solid state storage device, based at least in part on the data size and on the stored usable size to write to the one or more memory pages of the solid state storage device; and
write the unit of data to the selected one or more pages of the solid state storage device.

21. The system of claim 20, wherein to write the unit of data, the memory control module is operatively enabled to perform or cause to be performed:
write the unit of data starting from the first address value corresponding to each of the one or more pages.

22. The system of claim 20, wherein to write the unit of data, the memory control module is operatively enabled to perform or cause to be performed:
determine the direction to write to the memory page and write the unit of data in the determined direction to write.

23. The system of claim 22, wherein to write the unit of data, the memory control module is operatively enabled to perform or cause to be performed:
write the unit of data in a forward direction, wherein the unit of data is written to one or more of the memory cells of the page in an ascending order of cell addresses.

24. The system of claim 22, wherein to write the unit of data, the memory control module is operatively enabled to perform or cause to be performed:
write the unit of data in a backward direction, wherein the unit of data is written to one or more of the memory cells of the page in a descending order of cell addresses.

25. The system of claim 19, wherein the memory control module is further operatively enabled to perform or cause to be performed:
generate a table comprising a page address, the first address value, and the determined usable size of the memory page of the solid state storage device.

26. The system of claim 22, wherein the memory control module is further operatively enabled to perform or cause to be performed:
detect a request to read data from one or more memory pages of the solid state storage device; and
read data from the one or more memory pages of the solid state storage device starting from the first address value.

* * * * *

UNITED STATES PATENT AND TRADEMARK OFFICE
CERTIFICATE OF CORRECTION

PATENT NO. : 9,177,652 B2
APPLICATION NO. : 14/235406
DATED : November 3, 2015
INVENTOR(S) : Oh Page 1 of 2

It is certified that error appears in the above-identified patent and that said Letters Patent is hereby corrected as shown below:

On the Title Page, in Item (75), under "Inventor", in Column 1, Line 1, delete "Gwachon-si (KR)" and insert -- Gwacheon-si (KR) --, therefor.

IN THE DRAWINGS

In Fig. 6, Sheet 5 of 5, for Tag "(671)", Line 2, delete "interface" and insert -- Interface --, therefor.

In Fig. 6, Sheet 5 of 5, delete "uP/uC / DSP" and insert -- µP/µC/DSP --, therefor.

In Fig. 6, Sheet 5 of 5, delete " " and insert -- --, therefor.

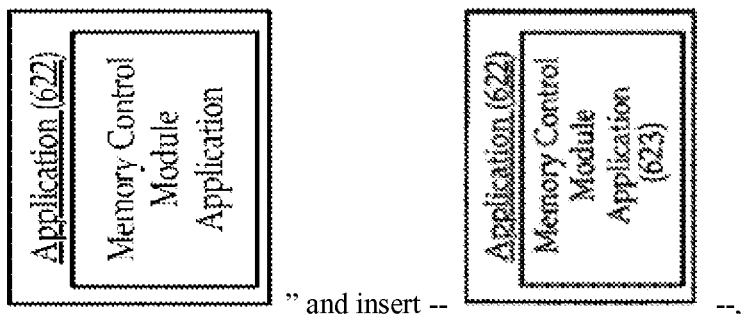

IN THE SPECIFICATION

In Column 1, Line 4, delete "a" and insert -- is a --, therefor.

In Column 1, Line 5, delete "§371" and insert -- § 371 --, therefor.

In Column 2, Line 59, delete "Figures," and insert -- figures, --, therefor.

In Column 11, Line 8, delete "disk drives" and insert -- disc drives --, therefor.

Signed and Sealed this
First Day of March, 2016

Michelle K. Lee
*Director of the United States Patent and Trademark Office*

CERTIFICATE OF CORRECTION (continued)
U.S. Pat. No. 9,177,652 B2

In Column 11, Line 8, delete "disk (CD)" and insert -- disc (CD) --, therefor.

In Column 11, Line 9, delete "disk (DVD)" and insert -- disc (DVD) --, therefor.

In Column 11, Line 19, delete "disks (DVD)" and insert -- discs (DVD) --, therefor.

In Column 11, Line 34, delete "NV ports" and insert -- A/V ports --, therefor.

In Column 13, Line 27, delete "and or" and insert -- and/or --, therefor.

In Column 13, Line 38, delete "Disk" and insert -- Disc --, therefor.